(12) United States Patent
Cheng et al.

(10) Patent No.: US 8,665,654 B2
(45) Date of Patent: Mar. 4, 2014

(54) MEMORY EDGE CELL

(71) Applicant: Taiwan Semiconductor Manufacturing Company, Ltd., Hsinchu (TW)

(72) Inventors: Hong-Chen Cheng, Hsinchu (TW); Ming-Yi Lee, Zhudong Township (TW); Kuo-Hua Pan, Hsinchu (TW); Jung-Hsuan Chen, Hsinchu (TW); Li-Chun Tien, Tainan (TW); Cheng Hung Lee, Hsinchu (TW); Hung-Jen Liao, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/924,176

(22) Filed: Jun. 21, 2013

(65) Prior Publication Data

US 2013/0286708 A1     Oct. 31, 2013

Related U.S. Application Data

(62) Division of application No. 13/025,872, filed on Feb. 11, 2011, now Pat. No. 8,482,990.

(51) Int. Cl.
*G11C 7/10*     (2006.01)

(52) U.S. Cl.
USPC ............. 365/189.05; 365/230.08; 365/185.2; 365/189.09

(58) Field of Classification Search
USPC ................ 365/189.05, 230.08, 185.2, 189.09
See application file for complete search history.

(56) References Cited

U.S. PATENT DOCUMENTS

2002/0131294 A1*   9/2002   Forbes ........................ 365/154

* cited by examiner

*Primary Examiner* — Jason Lappas
(74) *Attorney, Agent, or Firm* — Lowe Hauptman & Ham, LLP

(57) ABSTRACT

A column of a memory includes a first edge cell and at least one memory cell. The first edge cell is located at a first edge of the column and includes a first edge cell reference node and a second edge cell reference node. Each of the at least one memory cells includes a first memory reference node. The first edge cell reference node is coupled to respective first memory reference nodes of the at least one memory cell. The second edge cell reference node serves as second memory reference nodes of the at least one memory cell. Front-end layers of the first edge cell are the same as front-end layers of a memory cell of the at least one memory cell.

20 Claims, 9 Drawing Sheets

| MODE | N4 | N5 |
|---|---|---|
| (1) Idle/Read/Write | On | On |
| (2) Sleep | Off | On |
| (3) Shut Down | Off | Off |
| (4) Not allowed | On | Off |

400

| MODE | N5 | N4 | N6 |
|---|---|---|---|
| (1) Shut Down | Off | Off (Forced) | Off (Forced) |
| (2) Sleep | On | Off | Off (Forced) |
| (3) Idle/Read/Write | On | On | Off |
| (4) Turbo | On | On | On |

600

| MODE | N5 | N4 and N4-2 | N6 |
|---|---|---|---|
| (1) Shut Down | Off | Off (Forced) | Off (Forced) |
| (2) Sleep | On | Off | Off (Forced) |
| (3) Idle/Read/Write | On | On | Off |
| (4) Turbo | On | On | On |

800

MEMORY EDGE CELL

PRIORITY CLAIM

The present application is a divisional of U.S. application Ser. No. 13/025,872, filed Feb. 11, 2011, the disclosure of which is incorporated herein by reference in its entirety.

FIELD

The present disclosure is related to a memory edge cell.

BACKGROUND

Generally, when a memory cell in a Static Random Access Memory (SRAM) enters a standby mode, to reduce the leakage current, the operational voltage of the memory is reduced to a voltage sufficient to retain the data, commonly called the "retaining voltage." In many approaches, the power management circuitry that controls the retaining voltage is implemented by logic devices that need area overheads and that do not work well with devices manufactured by a memory process. For example, in an approach, the SRAM retaining voltage is generated by a diode connected logic device. Because SRAMs and logic devices have different manufacturing process variations, the retaining voltage while functioning for the logic device can cause loss of data in the SRAM. In another approach, the retaining voltage is generated by a voltage regulator, which requires a longer wake up time and consumes lots of power. In another approach, the SRAM edge cell requires a large die area for a short bit line in segmented SRAMs and register files.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
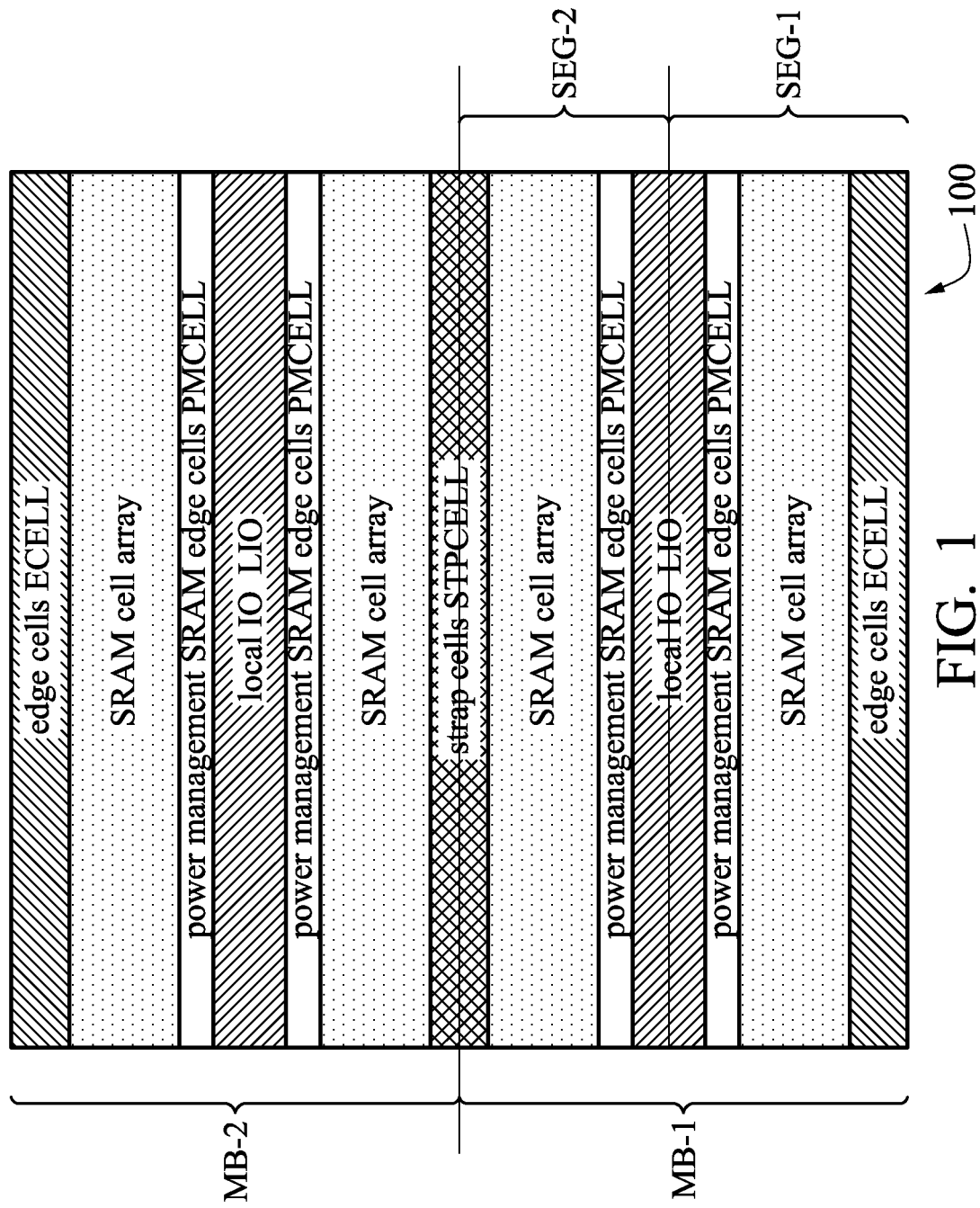
FIG. 1 is a block diagram of a memory, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The power management edge cell in accordance with some embodiments is about one-half smaller than an edge cell in another approach. The power management edge cell includes mechanisms to generate a voltage reference for the retaining voltage with a reduced current leakage. The front-end layers of the power management edge cell are the same as the front-end layers of the memory cell. As a result, the model of a memory cell can be used to simulate the power management edge cell.

Exemplary Memory

FIG. 1 is a block diagram of a memory or SRAM 100, in accordance with some embodiments.

Memory 100 includes a plurality of banks. For illustration, two memory banks MB-1 and MB-2 are shown, and the details of only memory bank MB-1 are labeled. A memory bank includes a plurality of segments. For illustration, memory bank MB-1 is shown having two segments SEG-1 and SEG-2.

A plurality of strap cells STPCELL is shared between two memory arrays. In FIG. 1, because strap cells STPCELL are shared between two arrays of two memory banks MB-1 and MB-2, strap cells STPCELL are effectively shared between two memory banks MB-1 and MB-2.

The edges of a memory bank include a plurality of either strap cells STPCELL or edge cells ECELL. For example, the top edge of memory bank MB-1 includes a plurality of strap cells STPCELL, and the bottom edge of memory bank MB-1 includes a plurality of edge cells ECELL.

The edges of memory 100 include a plurality of edge cells ECELL at the respective top edge and bottom edge of memory 100.

A memory array includes a plurality of memory cells or bit cells arranged in rows and columns. Each of segments SEG-1 and SEG-2 includes a respective memory array. Each memory array includes a plurality of memory cells MC (not labeled).

The edges of a memory cell array include a plurality of either edge cells ECELL, power management edge cells PMCELL, or strap cells STPCELL. For example, the top edge of the memory array of SEG-1 includes a first plurality of power management edge cells, and the bottom edge of the memory array of SEG-1 includes a first plurality of edge cells ECELL. In contrast, the top edge of the memory array of SEG-2 includes a plurality of strap cells STPCELL while the bottom edge of the memory array of SEG-2 includes a second plurality of power management edge cells PMCELL. In some embodiments, edge cells ECELL, strap cells STPCELL and power management cells PMCELL create an environment at the boundary or edges of the memory arrays to protect the inside memory cells MC. From a column perspective, a column of cells in segment SEG-1 includes a power management cell PMCELL at the top of the column, a plurality of memory cells MC below the power management cell PMCELL, and an edge cell ECELL at the bottom of the column. Similarly, a column of cells in segment SEG-2 includes a strap cell STCELL at the top of the column, a plurality of memory cells MC below the strap cell STCELL, and a power management cell PMCELL at the bottom of the column.

In some embodiments, a power management cell PMCELL and a memory cell MC have the same transistors (illustrated in FIG. 9) with different configurations. As a result, a power management cell PMCELL and a memory cell MC have the same layout below a metal one layer. In some embodiments, the metal layers include the metal one layer below a metal two layer, which, in turn, is below a metal three layer, etc. The layers below the metal one layer are also commonly called the front-end layers, and include, for example, a contact area, a poly area, a diffusion area, etc. Front end layers are distinguished from back-end layers, which refer to the metal layers and the vias. Stated differently, a power management cell PMCELL and a memory cell MC have the same front-end layers. As a result, the simulation model for a memory cell MC can be used to simulate the power management edge cell PMCELL. Further, without the power management edge cells PMCELL at the edge of a memory array, memory cells MC at the edge of the memory array would not have the same performance as memory cells MC that are not at the edge of the memory array due to the nature of the manufacturing process.

Figure 2:
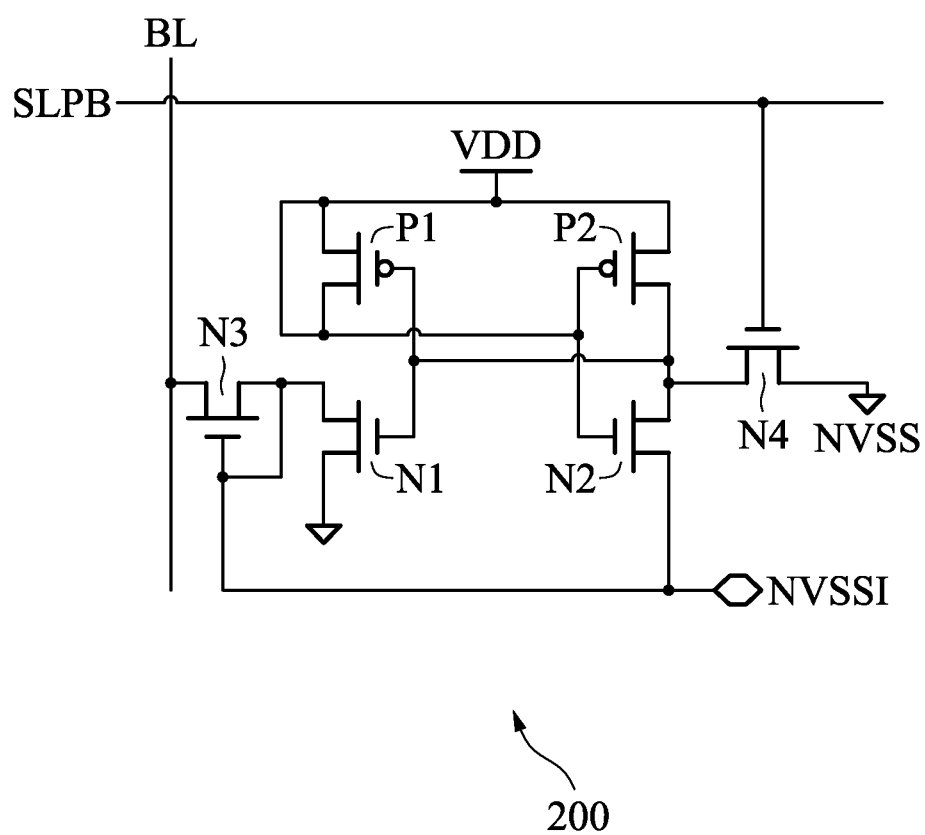
FIG. 2 is a detailed circuit of a power management edge cell of the memory in FIG. 1, in accordance with a first embodiment.

In some embodiments, a power management edge cell PMCELL provides ground reference voltages for a retaining voltage with a minimum leakage current because the retaining voltage is referenced to a raised voltage VSSI (illustrated in FIG. 2).

A row of local input/output circuits LIO is shared between two segments and includes circuitry for controlling the respective segments.

Power Management Edge Cell

1$^{st}$ Embodiment

FIG. 2 is a diagram of a circuit 200 illustrating a power management edge cell PMCELL, in accordance with a first embodiment.

Figure 9:
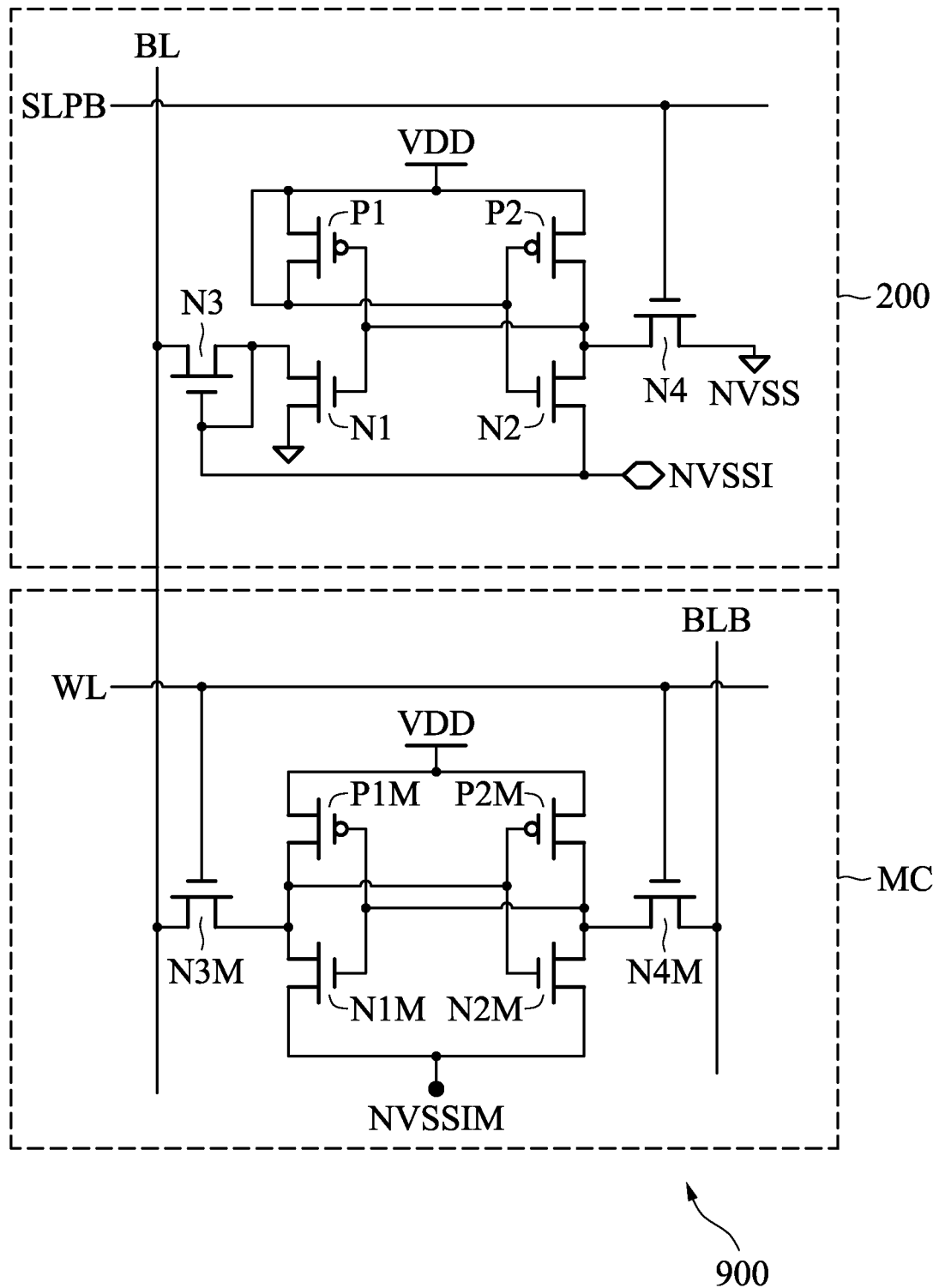
FIG. 9 is a diagram of a circuit illustrating a connection of a power management cell and a memory cell of the memory in FIG. 1, in accordance with some embodiments.

Nodes NVSS and NVSSI have respective voltages VSS and VSSI that are provided to memory cells MC in memory 100, the details of which are explained with reference to FIG. 9. For illustration purposes, memory cells MC coupled to circuit 200 are called memory cells MCPM. Further, because the internal ground nodes NVSSIM of memory cells MCPM illustrated in FIG. 9 are coupled to nodes NVSSI of power management edge cell PMCELL, internal ground nodes NVSSIM and nodes NVSSI are used interchangeably in this document.

The voltage level of node NVSSI is at either voltage VSS of node NVSS when transistors N4 and N2 are on or at a raised voltage at the drain of transistor N1 functioning as a diode, which is explained below. As a result, memory cells MCPM have a ground reference voltage level at either voltage VSSI or voltage VSS. Stated differently, a power management edge cell PMCELL provides the bias or reference voltage to the internal ground nodes NVSSIM of memory cells MCPM, and therefore serves as a power management cell for memory 100.

The pair of PMOS transistors P1 and P2, and the pair of NMOS transistors N1 and N2 correspond to a pair of PMOS transistors and a pair of NMOS transistors that form a cross latch in a memory cell MC. The gates of transistors P1 and N1 and the drain of transistor P2 are coupled together. The gates of transistors P2 and N2 and the drain of transistor P1 are coupled together. The drain and the source of transistor P1, the source of transistor P2, and a supply voltage source having operational voltage VDD are coupled together. Because the drain of transistor P1 is coupled to the gates of PMOS transistor P2 and NMOS transistor N2 being at voltage VDD, transistor P2 is always off while transistor N2 is always on.

The drain and the source of transistor N3 are functionally interchangeable, i.e., the drain functions as the source and the source functions as the drain. Similarly, the drain and the source of transistor N4 are functionally interchangeable.

The drains of transistors P2 and N2 and the source of transistor N4 are coupled together. The drain of transistor N4 is coupled to node NVSS having voltage VSS. The gate of transistor N4 is coupled to a signal line SLPB. In effect, transistor N4 is controlled by the signal on line SLPB, which, for simplicity, is also called signal SLPB. When signal SLPB is applied with a High, transistor N4 is on. But when signal SLPB is applied with a Low, transistor N4 is off.

The source of transistor N2, node NVSSI having voltage VSSI, and the gate and the drain of transistor N3 are coupled together. Node NVSSI is coupled to the internal ground node NVSSIM of a memory cell MCPM. The source of transistor N3 is coupled to a bit line BL, which couples the memory cells in a column. The drain of transistor N3 is coupled to the drain of transistor N1. Because the gate of transistor N3 is coupled to node NVSSI having voltage VSSI at a low logic level, transistor N3 is always off.

When transistor N4 is on, the voltage at the source of transistor N4 is the same as voltage VSS of node NVSS at the drain of transistor N4. Because transistor N2 is always on, node NVSSI at the source of transistor N2 has the same voltage as that of at the drain of transistor N2. Because the source of transistor N4 is coupled to the drain of transistor N2, node NVSSI at the source of transistor N2 is at voltage VSS of node NVSS at the drain of transistor N4. In contrast, when transistor N4 is off, transistor N4 functions as an open circuit, and is electrically disconnected from the drains of transistors N2 and P2. Because transistor N2 is always on, the drain and the source of transistor N2 are at the same voltage level. Because the drain of transistor N2 is coupled to the gate of transistor N1, and the source of transistor N2 is coupled to the drain of transistor N1 through the gate of transistor N3, the drain and the gate of transistor N1 are at the same voltage level. In effect, transistor N1 functions as a diode. As a result, node NVSSI coupled to the drain of transistor N1 is at a voltage level equal to a diode voltage drop of transistor N1 functioning as a diode. Stated differently, the ground reference of circuit 200 and of the memory cells MCPM coupled to circuit 200 is raised by a diode voltage of the transistor functioning as a diode N1. In some embodiments, the retaining voltage of memory 100 is based on the raised reference voltage of node NVSSI. In some embodiments, the diode voltage of transistor N1 is about the threshold voltage of transistor N1, which is about 250 mV for a 0.85 V VDD transistor.

Power Management Edge Cell

2$^{nd}$ Embodiment

Figure 3:
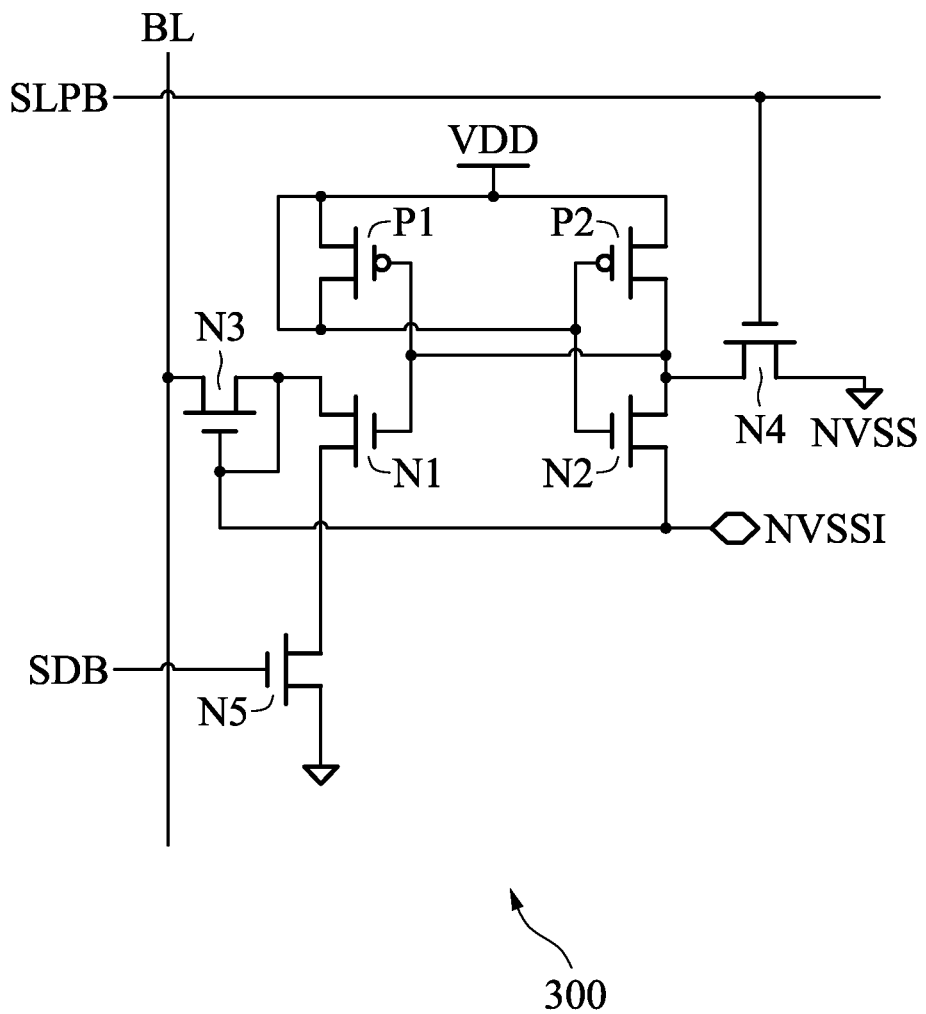
FIG. 3 is a detailed circuit of a power management edge cell of the memory in FIG. 1, in accordance with a second embodiment.

FIG. 3 is a diagram of a circuit 300 illustrating a power management edge cell PMCELL, in accordance with a second embodiment.

Compared with circuit 200, circuit 300 additionally includes transistor N5 controlled by signal SDB. The drain of transistor N5 is coupled to the source of transistor N1. The source of transistor N5 is coupled to ground.

In some embodiments, transistors P1, P2, N1, N2, N3, and N4 are manufactured by a "memory" manufacturing process, which refers to a manufacturing process used to manufacture memory devices. In contrast, transistor N5 is manufactured by a "logic" manufacturing process, which refers to the process used to manufacture logic devices. For illustration purposes, a transistor manufactured by a memory process is called a memory transistor, while a transistor manufactured by a logic process is called a logic transistor. Consequentially, transistor N5 is called a logic transistor. In some embodiments, memory transistors have threshold voltages different from those of logic transistors.

Transistor N5 acts as a power switch. When transistor N5 is off, transistor N5 functions as an open circuit. If transistor N4 is off, circuit 200 is shut down because there is no ground reference voltage for transistors N4, N2, and N1. Explained differently, internal ground node NVSSI is floating. In effect, all data stored in the memory cells MC working with circuit 200 are destroyed.

When transistor N5 is on, the drain of transistor N5 is at the same low voltage level or ground at the source of transistor N5. Because the source of transistor N1 is coupled to the drain of transistor N5, the source of transistor N1 is also at the ground level. In effect, transistor N5 provides the ground path for transistor N1. Explained differently, the source of transistor N1 is electrically coupled to ground at the source of transistor N5. As a result, circuit 300 functions in a similar manner as circuit 200. That is, when transistor N5 is on and transistor N4 is off, node NVSSI is raised by the diode voltage of transistor N1 functioning as a diode as explained above.

When transistor N4 is on, the voltage level at the source of transistor N4 is pulled to the VSS voltage level at the drain of transistor N4. Because transistor N2 is always on, the voltage level at the drain and at node NVSSI at the source of transistor N2 are the same. Because the source of transistor N4 is coupled to the drain of transistor N2, the voltage level at node NVSSI at the source of transistor N2 is at voltage VSS at the drain of transistor N4. In some embodiments, when transistor N4 is on, transistor N5 is prohibited from being turned off.

Figure 4:
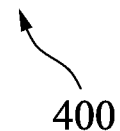
FIG. 4 is a table summarizing the operation of the circuit in FIG. 3, in accordance with some embodiments.

FIG. 4 is a table 400 summarizing the operation of circuit 300, in accordance with some embodiments.

On line (1), when both transistor N4 and N5 are on, circuit 300 sets memory cells MCPM in the idle or read or write mode because internal ground node NVSSI is at voltage VSS.

On line (2), when transistor N4 is off and transistor N5 is on, memory cells MCPM are in a sleep mode because internal ground node NVSSI is raised by the diode voltage of transistor N1.

On line (3), when both transistors N4 and N5 are off, memory cells MCPM are shut down because there is no ground reference for transistors N1 and N2.

On line (4), circuit 300 is prohibited from having transistor N4 on while transistor N5 is off.

Power Management Edge Cell

3$^{rd}$ Embodiment

Figure 5:
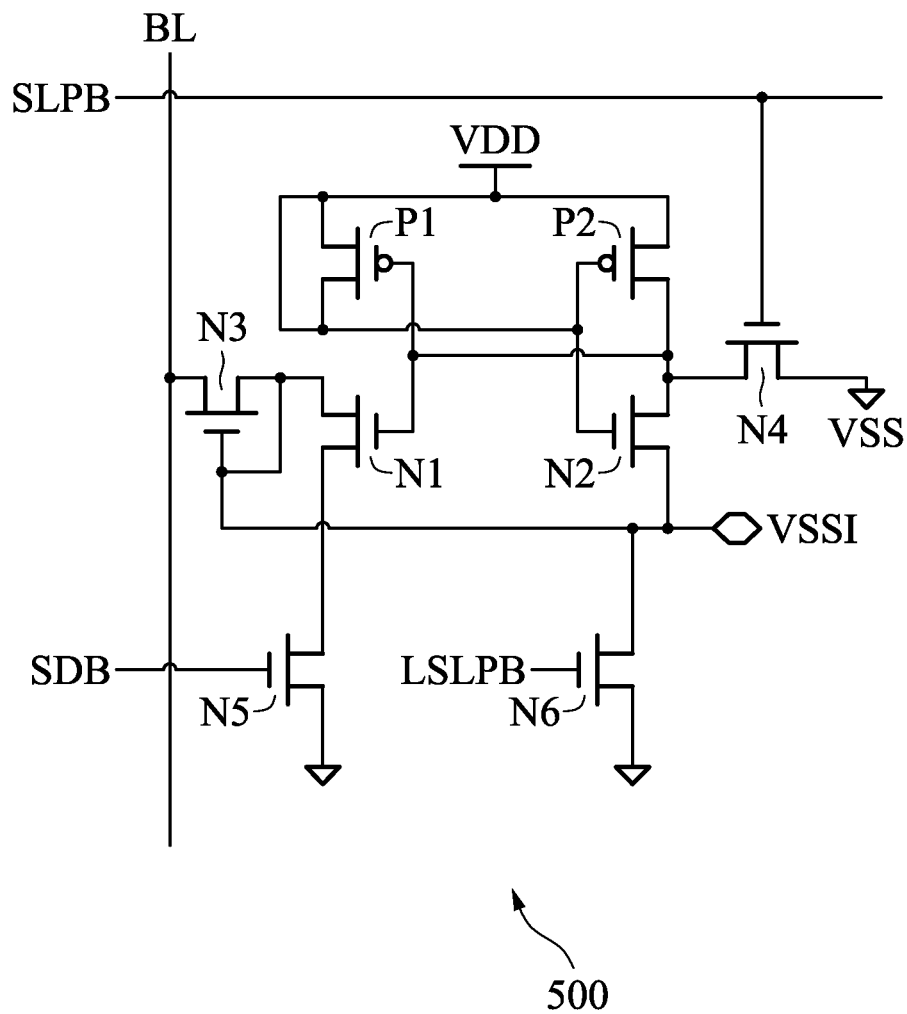
FIG. 5 is a detailed circuit of a power management edge cell of the memory in FIG. 1, in accordance with a third embodiment.

FIG. 5 is a detailed circuit 500 illustrating a power management edge cell PMCELL, in accordance with a third embodiment.

Compared with circuit 300, circuit 500 additionally includes transistor N6 controlled by signal LSLPB. The drain of transistor N6 is coupled to node NVSSI. The source of transistor N6 is coupled to ground or node NVSS. In some embodiments, transistor N6 is a logic transistor.

When transistor N6 is on, node NVSSI at the drain of transistor N6 is pulled to the VSS voltage level at the source of transistor N6. In effect, the internal ground nodes NVSSI of memory cells MCPM are at the normal low voltage level VSS. In some embodiments, transistor N6 is a logic transistor and has a resistance less than the combined resistance of both transistors N2 and N4. As a result, transistor N6 provides a stronger current to pull node NVSSI at the drain of transistor N6 to voltage VSS at the source of transistor N6. When transistor N6 is off, transistor N6 functions as an open circuit. As a result, circuit 500 functions in the same manner as circuit 300 that does not include transistor N6.

Figure 6:
FIG. 6 is a table summarizing the operation of the circuit in FIG. 5, in accordance with some embodiments.

FIG. 6 is a table 600 summarizing the operation of circuit 500, in accordance with some embodiments.

On line (1), when transistor N5 is off, transistors N4 and N6 are forced to be off. Circuit 500 is in the shut down mode.

On line (2), when transistor N5 is on and transistor N4 is off, transistor N6 is forced to be off. Circuit 500 is in the sleep mode. Node NVSSI has a raised voltage level at voltage VSSI through diode N1. Transistor N5 provides the ground path for transistor N1.

On line (3), when transistor N5 is on, transistor N4 is on, and transistor N6 is off. Circuit 500 is in the Idle/Read/Write mode similar to line (1) in table 400. Voltage VSSI at node NVSSI at the source of transistor N2 is at the same VSS voltage level at the source of transistor N4.

On line (4), when transistors N5, N6, and N4 are on, circuit 500 is in the turbo mode. Node NVSSI at the drain of transistor N6 is pulled to the VSS voltage level at the source of transistor N6.

Power Management Edge Cell

4$^{th}$ Embodiment

Figure 7:
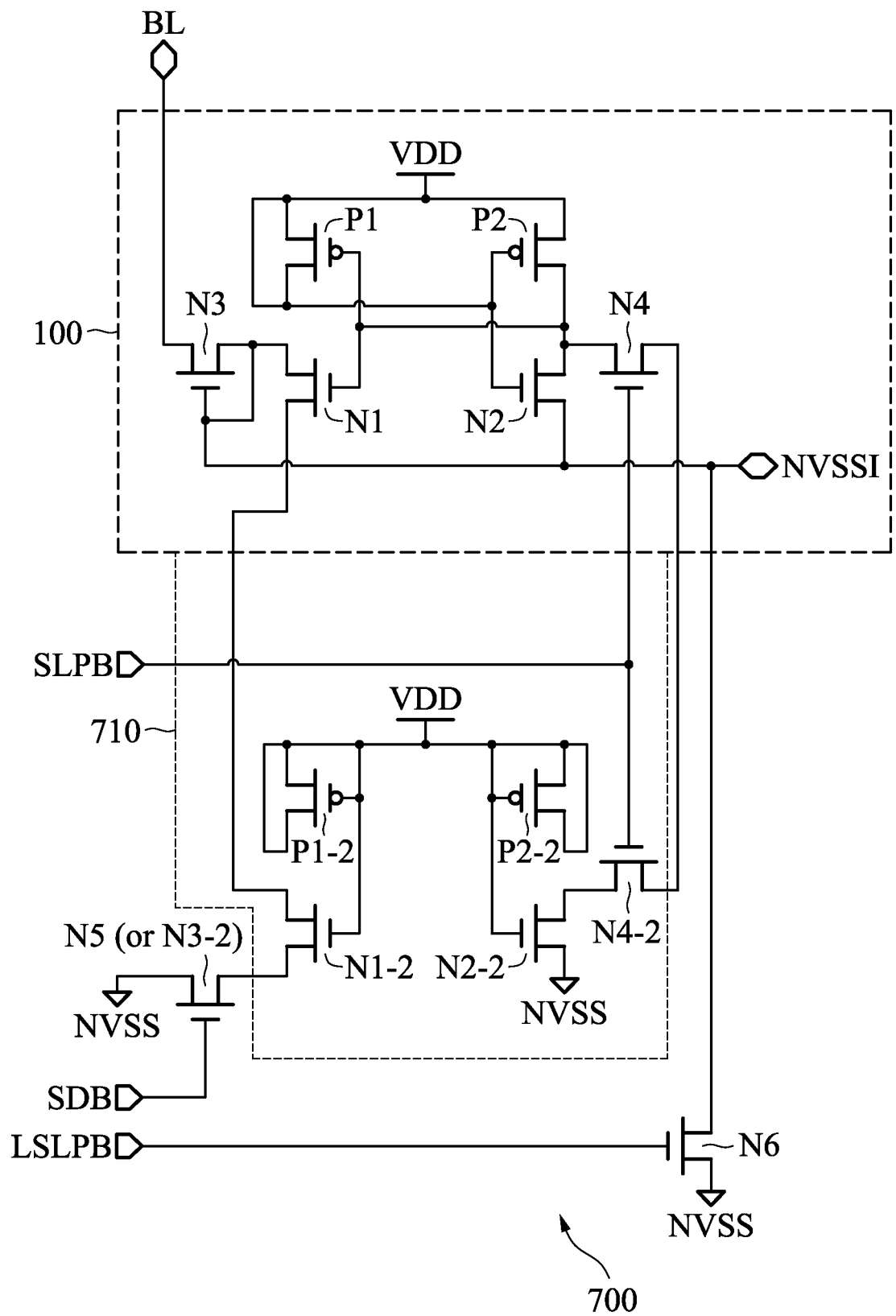
FIG. 7 is a detailed circuit of a power management edge cell of the memory in FIG. 1, in accordance with a fourth embodiment.

FIG. 7 is a detailed circuit 700 illustrating a power management edge cell PMCELL, in accordance with a fourth embodiment.

Circuit 700 includes circuit 100 coupled with a circuit 710. Circuit 710 has similar transistors as those in circuit 100 with different configurations. Transistors P1-2, P2-2, N1-2, N2-2, N3-2 and N4-2 of circuit 710 correspond to respective transistors P1, P2, N1, N2, N3, and N4 of circuit 100. In addition, transistor N3-2 functions in a manner similar to transistor N5 in circuit 500. As a result, transistor N3-2 in circuit 710 can be considered equivalent to transistor N5 in circuit 500. For illustration purposes, transistors N3-2 and N5 are used interchangeably. Circuit 700 also includes transistor N6 that functions in the same manner as transistor N6 in circuit 500.

The gate, the drain, and the source of transistor P1-2, voltage VDD, and the gate of transistor N1-2 are coupled together. Because the gate of transistor N1-2 is coupled to voltage VDD, transistor N1-2 is always on. As a result, the drain and the source of transistor N1-2 are at the same voltage level. Because the source of transistor N1 is coupled to the drain of transistor N1-2, the voltage level at the source of transistor N1 is at the same voltage level at the source of transistor N1-2. When transistor N5 is on, the drain and the source of transistor N5 are at the same voltage level. Because the source of transistor N1-2 is coupled to the drain of transistor N5, when transistor N5 is on, the source of transistor N1-2 is at the same VSS voltage level at the source of transistor N5. In effect, when transistor N5 is on, the source of transistor N1 is at voltage VSS of node NVSS.

The gate, the drain and the source of transistor P2-2, voltage VDD, and the gate of transistor N2-2 are coupled together. Because the gate of transistor N2-2 is at voltage VDD, transistor N2-2 is always on. As a result, the drain and the source of transistor N2-2 are at the same level.

Signal SLPB at the gates of transistors N4 and N4-2 turns on or off transistors N4 and N4-2 at the same time. When transistors N4 and N4-2 are on (e.g., by activating signal SLPB), the drain and the source of transistor N4 are at the same voltage level, and the drain and the source of transistor N4-2 are at the same voltage level. Because the drains of transistors N4 and N4-2 are coupled together, the source of transistor N4-2 is at the same voltage level at the source of transistor N4. Because transistor N2 is always on, the drain and the source of transistor N2 are at the same level. Consequently, node NVSSI at the source of transistor N2 is at the same level at the source of transistor N4. In effect, when transistors N4 and N4-2 are on, node NVSSI at the source of transistor N2 is at voltage VSS of node NVSS at the source of transistor N2-2.

Compared with circuit 500, circuit 700 has less leakage current. In circuit 700, while node NVSSI at the source of transistor N2 is pulled to voltage VSS at the source of transistor N2-2, the current flows from node NVSSI through four transistors N2, N4, N4-2, and N2-2 to ground. In contrast, in circuit 500, while node NVSSI at the source of transistor N2 is pulled to voltage VSS at the drain of transistor N4, the current flows through two transistors N2 and N4 to ground. In effect, transistors N4-2 and N2-2 provide additional resistance in circuit 700 to reduce the current flow or the leakage current.

Similar to circuit 500, when transistor N6 is on, node NVSSI at the drain of transistor N6 is pulled to voltage VSS of node NVSS at the source of transistor N6. Stated differently, node NVSSI is at voltage VSS. When transistor N6 is off, transistor N6 acts as an open circuit. Node NVSSI at the source of transistor N2 is electrically disconnected from the drain of transistor N6, and is affected by other transistors through the source of transistor N2 and the gate and the drain of transistor N3.

Figure 8:
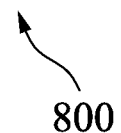
FIG. 8 is a table summarizing the operation of the circuit in FIG. 7, in accordance with some embodiments.

FIG. 8 is a table 800 summarizing the operation of circuit 700, in accordance with some embodiments. Table 800 is similar to table 600 except that in table 600 transistor N4 functions individually while, in table 800, transistors N4 and N4-2 are turned on or off at the same time.

On line (1), when transistor N5 is off, transistors N4, N4-2, and N6 are forced to be off. Circuit 700 is in the shut down mode because transistor N5 acts as an open circuit and there is no ground for transistor N1-2, N1, N4 and N2-2.

On line (2), when transistor N5 is on and transistors N4 and N4-2 are off, transistor N6 is forced to be off. Circuit 700 is in the sleep mode. Node NVSSI has a raised voltage level at voltage VSSI through diode N1. Because transistor N5 is on, voltage VSS at the source of transistor N5 serves as a current path for the current at the source of transistor N1 flowing through transistor N1-2 and N5.

On line (3), when transistor N5 is on, transistors N4 and N4-2 are on, and transistor N6 is off. Circuit 700 is in the Idle/Read/Write mode. Voltage VSSI at node NVSSI at the source of transistor N2 is at the same voltage level at the source of transistor N2-2 through the drain of transistor N2 coupled to the source of transistor N4, the drain of transistor N4 coupled to the drain of transistor N4-2, and the source of transistor N4-2 coupled to the drain of transistor N2-2.

On line (4), when transistors N5, N6, and N4 are on, circuit 700 is in the turbo mode. Node NVSSI at the drain of transistor N6 is pulled to the VSS voltage level at the source of transistor N6. In some embodiments, the resistance of transistor N6 is much less compared to the resistance of cascaded transistors N2-2, N4-2, N4 and N2. At the same time, node NVSSI at the source of transistor N2 is at the same voltage level at the source of transistor N2-2 through the drain of transistor N2 coupled to the source of transistor N4, the drain of transistor N4 coupled to the drain of transistor N4-2, and the source of transistor N4-2 coupled to the drain of transistor N2-2. In effect, node NVSSI is at voltage VSS at both the source of transistor N6 and the source of transistor N2-2.

Exemplary Connection of a Memory Cell and a Power Management Cell

FIG. 9 is a diagram of a circuit 900 illustrating a connection of a memory cell MC and a power management edge cell 200, in accordance with some embodiments.

Memory cell MC includes transistors P1M, P2M, N1M, N2M, N3M, N4M corresponding to transistors P1, P2, N1, N2, N3, and N4 of cell 200, respectively. Transistor P1M, P2M, and N1M, and N2M form a cross latch for memory cell MC as should be recognizable by persons of ordinary skill in the art. Word line WL of memory cell MC corresponds to signal line SLPB of cell 200. In some embodiments, an available memory cell MC is used to form a power management edge cell 200. For example, the word line WL is used to form signal SLPB. The gate of transistor N3M is disconnected from word line WL and is connected to the source of transistor N2M. The source of transistor N2M is disconnected from ground. The drain of transistor P1M is disconnected from the drain of transistor N1M, and is connected to the source of transistor P1M. The drain of transistor N4M is disconnected from bit line BLB, and is connected to ground node NVSS, etc.

Internal ground node NVSSIM of memory cell MC is coupled to node NVSSI of power management edge cell 200. In effect, node NVSS of cell 200 serves as the ground or VSS node for memory cell MC. As a result, the ground reference of memory cell MC is either at the normal voltage VSS of node NVSS or at the raised voltage VSSI at node NVSSI when voltage VSSI is raised as explained above.

FIG. 9 is used for illustration. Additional memory cells MC are coupled to FIG. 9 as should be recognizable by persons of ordinary skill in the art. For example, internal ground nodes NVSSIM of the additional memory cells MC in a column are also coupled to node NVSSI of cell 200. Transistors N3M of the additional memory cells MC are coupled to bit line BL while transistors N4M of the additional memory cells MC are coupled to bit line BLB, etc. Circuit 900 is in fact a column of cells of memory array of memory 100. The memory cell MC at the bottom of the column is coupled either to a power management cell PMCELL, a strap cell STPCELL, or an edge cell ECELL as should be recognizable by persons of ordinary skill in the art. Circuit 200 is used for illustration in circuit 900. Other power management edge cells, including cells 300, 500, or 700 being used in place of circuit 200, are within the scope of various embodiments.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor, or NMOS and PMOS) are for illustration purposes, embodiments of the disclosure are not limited to a particular type. Selecting different dopant types is within the scope of various embodiments. The logic level (e.g., Low or High) of various signals used in the above description is also for illustration purposes. Various embodiments are not limited to a particular level when a signal is activated and/or deactivated. Selecting different logic levels is within the scope of various embodiments.

In accordance with at least one embodiment, a column of a memory includes a first edge cell and at least one memory cell. The first edge cell is located at a first edge of the column and includes a first edge cell reference node and a second edge cell reference node. Each of the at least one memory cells includes a first memory reference node. The first edge cell reference node is coupled to respective first memory reference nodes of the at least one memory cell. The second edge cell reference node serves as second memory reference nodes of the at least one memory cell. Front-end layers of the first edge cell are the same as front-end layers of a memory cell of the at least one memory cell.

In accordance with another embodiment, a memory circuit includes an input/output circuit coupled to a bit line, an edge cell coupled to the bit line, and at least one memory cell coupled to the bit line. The edge cell includes a first transistor, a second transistor, and a third transistor. The first transistor has a source coupled to a first voltage node, a drain coupled to the source, and a gate. The second transistor has a source coupled to a second voltage node, a gate coupled to the gate of the first transistor, and a drain coupled to a reference voltage node. The third transistor has a source coupled to the reference voltage node, a gate coupled to the source of the third transistor, and a drain coupled to the bit line. The edge cell is located between the at least one memory cell and the input/output circuit.

In accordance with another embodiment, a memory circuit includes an input/output circuit coupled to a bit line, a first edge cell coupled to the bit line, a second edge cell located adjacent to the first edge cell, and at least one memory cell coupled to the bit line. The first edge cell includes a first transistor, a second transistor, and a third transistor. The first transistor has a source coupled to a first voltage node, a drain coupled to the source, and a gate. The second transistor has a source coupled to a second voltage node, a gate coupled to the gate of the first transistor, and a drain. The third transistor has a source coupled to a reference voltage node, a gate coupled to the source of the third transistor, and a drain coupled to the bit line. The second edge cell includes a fourth transistor, a fifth transistor, and a sixth transistor. The fourth transistor has a source coupled to the first voltage node, a drain coupled to the source, and a gate coupled to the first voltage node. The fifth transistor has a source, a drain coupled to the source of the second transistor, and a gate coupled to the first voltage node. The sixth transistor has a source coupled to the second voltage node, a gate, and a drain coupled to the source of the fifth transistor. The first and second edge cells are located between the at least one memory cell and the input/output circuit.

The foregoing outlines features of several embodiments so that those skilled in the art may better understand the aspects of the present disclosure. Those skilled in the art would appreciate that they may readily use the present disclosure as a basis for designing or modifying other processes and structures for carrying out the same purposes and/or achieving the same advantages of the embodiments introduced herein. Those skilled in the art would also realize that such equivalent constructions do not depart from the spirit and scope of the present disclosure, and that they may make various changes, substitutions, and alterations herein without departing from the spirit and scope of the present disclosure.

What is claimed is:

1. A column of a memory comprising:
a first edge cell located at a first edge of the column and including a first edge cell reference node and a second edge cell reference node; and
at least one memory cell, each of the at least one memory cell including a first memory reference node,
wherein
the first edge cell reference node is coupled to one or more corresponding first memory reference nodes of the at least one memory cell;
the second edge cell reference node serves as second memory reference nodes of the at least one memory cell; and
front-end layers of the first edge cell are the same as front-end layers of a memory cell of the at least one memory cell.

2. The column of claim 1 further comprising a second edge cell located at a second edge of the column.

3. The column of claim 2, wherein the first edge cell is different from the second edge cell.

4. The column of claim 1, wherein:
a memory cell of the at least one memory cell includes a first memory PMOS transistor, a second memory PMOS transistor, a first memory NMOS transistor, a second memory NMOS transistor, a third memory NMOS transistor, and a fourth memory NMOS transistor;
the first edge cell includes a first PMOS transistor, a second PMOS transistor, a first NMOS transistor, a second NMOS transistor, a third NMOS transistor, and a fourth NMOS transistor;
the first memory PMOS transistor corresponds to the first PMOS transistor;
the second memory PMOS transistor corresponds to the second PMOS transistor;
the first memory NMOS transistor corresponds to the first NMOS transistor;
the second memory NMOS transistor corresponds to the second NMOS transistor;
the third memory NMOS transistor corresponds to the third NMOS transistor; and
the fourth memory NMOS transistor corresponds to the fourth NMOS transistor.

5. The column of claim 1, wherein
a memory cell of the at least one memory cell includes a first memory PMOS transistor, a second memory PMOS transistor, a first memory NMOS transistor, a second memory NMOS transistor, a third memory NMOS transistor, and a fourth memory NMOS transistor;
the first edge cell includes a first PMOS transistor, a second PMOS transistor, a first NMOS transistor, a second NMOS transistor, a third NMOS transistor, and a fourth NMOS transistor;
first PMOS memory front end layers of the first memory PMOS transistor are the same as first PMOS front end layers of the first PMOS transistor;
second PMOS memory front end layers of the first memory PMOS transistor are the same as second PMOS front end layers of the second PMOS transistor;
first NMOS memory front end layers of the first memory NMOS transistor are the same as first NMOS front end layers of the first NMOS transistor;
second NMOS memory front end layers of the second memory NMOS transistor are the same as second NMOS front end layers of the second NMOS transistor;
third NMOS memory front end layers of the third memory NMOS transistor are the same as third NMOS front end layers of the third NMOS transistor; and
fourth NMOS memory front end layers of the fourth memory NMOS transistor are the same as fourth NMOS front end layers of the fourth NMOS transistor.

6. The column of claim 5, wherein
- a first PMOS drain, a first PMOS source of the first PMOS transistor, a voltage source, a second PMOS gate of the second PMOS transistor, and a second NMOS gate of the second PMOS transistor are coupled together;
- a first PMOS gate of the first PMOS transistor, the first NMOS gate of the first NMOS transistor, a second PMOS drain of the second PMOS transistor, a second NMOS drain of the second NMOS transistor, and a fourth NMOS source of the fourth NMOS transistor are coupled together;
- a third NMOS gate of the third NMOS transistor, a third NMOS drain of the third NMOS transistor, a first NMOS drain of the first NMOS transistor, and a second NMOS source of the second NMOS transistor are coupled together and serve as a first voltage reference node; and
- a fourth NMOS drain of the fourth NMOS transistor is coupled to a second voltage reference node.

7. The column of claim 6 further comprising a fifth NMOS transistor having a fifth PMOS drain coupled to the first NMOS source and a fifth NMOS source coupled to the second voltage reference node.

8. The column of claim 6 further comprising a sixth NMOS transistor having a sixth NMOS drain coupled to the first voltage reference node and a six NMOS source coupled to the second voltage reference node.

9. The column of claim 1, wherein the first edge cell includes:
- a first PMOS transistor having a first PMOS drain, a first PMOS source, and a first PMOS gate;
- a second PMOS transistor having a second PMOS drain, a second PMOS source, and a second PMOS gate;
- a first NMOS transistor having a first NMOS drain, a first NMOS source, and a first NMOS gate;
- a second NMOS transistor having a second NMOS drain, a second NMOS source, and a second NMOS gate;
- a third NMOS transistor having a third NMOS drain, a third NMOS source, and a third NMOS gate;
- a fourth NMOS transistor having a fourth NMOS drain, a fourth NMOS source, and a fourth NMOS gate;
- a second first PMOS transistor having a second first PMOS drain, a second first PMOS source, and a second first PMOS gate;
- a second second PMOS transistor having a second second PMOS drain, a second second PMOS source, and a second second PMOS gate;
- a second first NMOS transistor having a second first NMOS drain, a second first NMOS source, and a second first NMOS gate;
- a second second NMOS transistor having a second second NMOS drain, a second second NMOS source, and a second second NMOS gate;
- a second third NMOS transistor having a second third NMOS drain, a second third NMOS source, and a second third NMOS gate;
- a second fourth NMOS transistor having a second fourth NMOS drain, a second fourth NMOS source, and a second fourth NMOS gate; and
- a fifth NMOS transistor having a fifth NMOS drain, a fifth NMOS source, and a fifth NMOS gate, wherein
- the first NMOS source and the second first NMOS drain are coupled together;
- the second first NMOS source and the second third NMOS drain are coupled together;
- the second first NMOS gate, the second second NMOS gate, and the voltage source are coupled together;
- the second second NMOS drain and the second fourth NMOS source are coupled together;
- the second second NMOS source and the second reference voltage node are coupled together;
- the second third NMOS gate and the first reference voltage node are coupled together;
- the fourth NMOS gate and the second fourth NMOS gate are coupled together;
- the fourth NMOS drain and the second fourth NMOS drain are coupled together;
- the fifth NMOS drain and the first voltage reference node are coupled together;
- the fifth NMOS source and the second voltage reference node are coupled together; and
- the second first PMOS drain, the second first PMOS source, the second first PMOS gate, the second second PMOS drain, the second second PMOS source, the second second PMOS gate, and the voltage source are coupled together.

10. A memory circuit comprising:
- a first voltage node;
- a second voltage node;
- a reference voltage node;
- a bit line;
- an input/output circuit coupled to the bit line;
- an edge cell coupled to the bit line, the edge cell comprising:
  - a first transistor having a source coupled to the first voltage node, a drain coupled to the source, and a gate;
  - a second transistor having a source coupled to the second voltage node, a gate coupled to the gate of the first transistor, and a drain coupled to the reference voltage node; and
  - a third transistor having a source coupled to the reference voltage node, a gate coupled to the source of the third transistor, and a drain coupled to the bit line; and
- at least one memory cell coupled to the bit line, the edge cell being located between the at least one memory cell and the input/output circuit.

11. The memory circuit of claim 10, wherein the first transistor is a transistor of a first type, and the second and third transistors are transistors of a second type.

12. The circuit of claim 11, wherein a transistor of the first type corresponds to a p-type transistor, and a transistor of the second type corresponds to an n-type transistor.

13. The memory circuit of claim 10, further comprising:
- a fourth transistor having a source coupled to the first voltage node, a drain coupled to the gate of the first transistor, and a gate coupled to the drain of the first transistor; and
- a fifth transistor having a source coupled to the reference voltage node, a drain coupled to drain of the fourth transistor, and a gate coupled to the gate of the fourth transistor,
wherein the first and fourth transistors are transistors of a first type, and the second and fifth transistor are transistors of a second type.

14. The memory circuit of claim 13, further comprising:
- a signal line; and
- a sixth transistor having a source coupled to the drain of the fifth transistor, a source coupled to the second voltage node, and a gate coupled to the signal line.

15. The memory circuit of claim 10, further comprising:
- another transistor having a source coupled to the second voltage node, and a drain coupled to the reference voltage node.

16. The memory circuit of claim 10, further comprising:
another transistor having a source coupled to the second voltage node, and a drain coupled to the source of the second transistor.

17. The memory circuit of claim 10, wherein configuration of front-end layers of the edge cell and the at least one memory cell are the same.

18. A memory circuit comprising:
a first voltage node;
a second voltage node;
a reference voltage node;
a bit line;
an input/output circuit coupled to the bit line;
a first edge cell coupled to the bit line, the first edge cell comprising:
   a first transistor having a source coupled to the first voltage node, a drain coupled to the source, and a gate;
   a second transistor having a source coupled to the second voltage node, a gate coupled to the gate of the first transistor, and a drain; and
   a third transistor having a source coupled to the reference voltage node, a gate coupled to the source of the third transistor, and a drain coupled to the bit line;
a second edge cell located adjacent to the first edge cell, the second edge cell comprising:
   a fourth transistor having a source coupled to the first voltage node, a drain coupled to the source, and a gate coupled to the first voltage node;
   a fifth transistor having a source, a drain coupled to the source of the second transistor, and a gate coupled to the first voltage node; and
   a sixth transistor having a source coupled to the second voltage node, a gate, and a drain coupled to the source of the fifth transistor; and
at least one memory cell coupled to the bit line, the first and second edge cells being located between the at least one memory cell and the input/output circuit.

19. The memory circuit of claim 18, further comprising:
a seventh transistor having a source coupled to the second voltage node, and a drain coupled to the reference voltage node.

20. The memory circuit of claim 18, wherein configurations of front-end layers of the first edge cell, the second edge cell, and the at least one memory cell are the same.

\* \* \* \* \*